US009445493B2

(12) United States Patent
Kato et al.

(10) Patent No.: US 9,445,493 B2
(45) Date of Patent: Sep. 13, 2016

(54) SIGNAL LINE AND MANUFACTURING METHOD THEREFOR

(71) Applicant: Murata Manufacturing Co., Ltd., Nagaokakyo-shi, Kyoto-fu (JP)

(72) Inventors: Noboru Kato, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/818,369

(22) Filed: Aug. 5, 2015

(65) Prior Publication Data

US 2015/0342028 A1 Nov. 26, 2015

Related U.S. Application Data

(63) Continuation of application No. 13/343,738, filed on Jan. 5, 2012, now Pat. No. 9,374,886, which is a continuation of application No. PCT/JP2010/060955, filed on Jun. 28, 2010.

(30) Foreign Application Priority Data

Jul. 13, 2009 (JP) .................. 2009-164819

(51) Int. Cl.
*H05K 1/00* (2006.01)
*H05K 1/02* (2006.01)
*H05K 3/28* (2006.01)
*H05K 3/46* (2006.01)

(52) U.S. Cl.
CPC ............ *H05K 1/0218* (2013.01); *H05K 1/028* (2013.01); *H05K 3/28* (2013.01); *H05K 3/4635* (2013.01); *H05K 2201/0715* (2013.01); *Y10T 29/49155* (2015.01)

(58) Field of Classification Search
CPC .............. H05K 1/0218; H05K 1/028; H05K 2201/0715; H05K 3/4635; H05K 3/28
USPC ......................................................... 174/254
See application file for complete search history.

(56) References Cited

U.S. PATENT DOCUMENTS 5,631,446 A * 5/1997 Quan .................... H01R 12/62
174/254
2002/0153611 A1* 10/2002 Nakanishi ............ H05K 1/0224
257/758

(Continued)

OTHER PUBLICATIONS

Kato et al., "Signal Line Path and Manufacturing Method Therefor", U.S. Appl. No. 13/343,738, filed Jan. 5, 2012.

*Primary Examiner* — Timothy Thompson
*Assistant Examiner* — Rhadames J Alonzo Miller
(74) *Attorney, Agent, or Firm* — Keating & Bennett, LLP

(57) ABSTRACT

A signal line that is easily inflected includes a laminated body including at least insulator layers that include flexible material and are laminated from a positive direction side in a z axis direction to a negative direction side therein in this order. A ground conductor is securely fixed to a main surface on the positive direction side of the insulation sheet in the z axis direction. A signal line is securely fixed to a main surface on the positive direction side of the insulator layer in the z axis direction. A ground conductor is securely fixed to a main surface on the positive direction side of the insulator layer in the z axis direction. The ground conductors and the signal line define a stripline structure. The laminated body is inflected so that the insulator layer is located on an inner periphery side, compared with a location of the insulator layer.

3 Claims, 4 Drawing Sheets

(56) References Cited

U.S. PATENT DOCUMENTS

| | | | |
|---|---|---|---|
| 2004/0229024 A1* | 11/2004 | Harada | H05K 1/0242 428/209 |
| 2007/0080439 A1* | 4/2007 | Kikuchi | H01L 21/6835 257/678 |
| 2008/0115963 A1* | 5/2008 | Tsukada | H05K 1/028 174/254 |
| 2009/0035591 A1* | 2/2009 | Nishikawa | B32B 15/08 428/458 |
| 2010/0127405 A1* | 5/2010 | Kikuchi | H01L 21/6835 257/776 |
| 2010/0156572 A1* | 6/2010 | Yang | H01P 3/003 333/238 |
| 2010/0225424 A1* | 9/2010 | Yeates | H01P 3/08 333/238 |

* cited by examiner

SIGNAL LINE AND MANUFACTURING METHOD THEREFOR

BACKGROUND OF THE INVENTION

1. Field of the Invention

The present invention relates to a signal line and a manufacturing method therefor, and, more specifically, relates to a signal line that is capable of being easily inflected and reduces unnecessary radiation, and a manufacturing method therefor.

2. Description of the Related Art

As a signal line of the related art, for example, a multi-layer circuit substrate described in Japanese Unexamined Patent Application Publication No. 2004-311627 is known. FIG. 6 is a cross-section structure diagram of a multilayer circuit substrate 500 described in Japanese Unexamined Patent Application Publication No. 2004-311627.

The multilayer circuit substrate 500 is configured using an insulation base material 502 (502a to 502d), a ground conductor pattern 504 (504a, 504b), and a strip-shaped conductor pattern 506. The insulation base material 502 includes thermoplastic resin such as liquid crystalline polymer or the like. The ground conductor pattern 504a is provided on the back surface of the insulation base material 502a. The ground conductor pattern 504b is provided on the front surface of the insulation base material 502d. The strip-shaped conductor pattern 506 is provided on the front surface of the insulation base material 502c. In addition, the insulation base materials 502a to 502d are laminated so as to be arranged from an upper side in a lamination direction to a lower side therein in this order. Accordingly, the ground conductor patterns 504a and 504b and the strip-shaped conductor pattern 506 form a stripline structure.

In addition, in the multilayer circuit substrate 500, the ground conductor patterns 504a and 504b and the strip-shaped conductor pattern 506 have configurations described below so as to improve the adhesion of the ground conductor patterns 504a and 504b and the strip-shaped conductor pattern 506 to the insulation base material 502. Specifically, the surface roughnesses of main surfaces where the ground conductor patterns 504a and 504b and the strip-shaped conductor pattern 506 adhere tightly to the insulation base material 502 are larger than the surface roughnesses of main surfaces located on the opposite sides of the corresponding main surfaces. Namely, the surface roughness of the main surface on the upper side of the ground conductor pattern 504a is larger than the surface roughness of the main surface on the lower side of the ground conductor pattern 504a. The surface roughness of the main surface on the lower side of the ground conductor pattern 504b is larger than the surface roughness of the main surface on the upper side of the ground conductor pattern 504b. The surface roughness of the main surface on the lower side of the strip-shaped conductor pattern 506 is larger than the surface roughness of the main surface on the upper side of the strip-shaped conductor pattern 506. According to such a configuration as described above, since the ground conductor patterns 504a and 504b and the strip-shaped conductor pattern 506 are embedded in the insulation base material 502, the adhesion strength of the insulation base material 502 is improved.

However, the multilayer circuit substrate 500 has a problem that it is difficult to inflect and use the multilayer circuit substrate 500. More specifically, the multilayer circuit substrate 500 is inflected so that the strip-shaped conductor pattern 506 forms a U shape. In this case, there exist a first inflection state in which the ground conductor pattern 504a is located on an outer periphery side and the ground conductor pattern 504b is located on an inner periphery side and a second inflection state in which the ground conductor pattern 504a is located on an inner periphery side and the ground conductor pattern 504b is located on an outer periphery side.

Here, in the first inflection state, from among the insulation base materials 502a to 502d, the insulation base material 502a located on an outermost periphery side is subjected to the largest tensile stress. However, the ground conductor pattern 504a adheres tightly to the insulation base material 502a on the main surface on the upper side. Since being manufactured using metal foil, it is hard for the ground conductor pattern 504a to stretch compared with the insulation base material 502a. Therefore, it is hard for the insulation base material 502a to fully stretch. As a result, it is hard for the multilayer circuit substrate 500 to be fully inflected in the first inflection state.

On the other hand, in the second inflection state, from among the insulation base materials 502a to 502d, the insulation base material 502d located on an outermost periphery side is subjected to the largest tensile stress. However, the ground conductor pattern 504b adheres tightly to the insulation base material 502d on the main surface on the lower side. Since being manufactured using metal foil, it is hard for the ground conductor pattern 504b to stretch compared with the insulation base material 502d. Therefore, it is hard for the insulation base material 502d to fully stretch. As a result, it is hard for the multilayer circuit substrate 500 to be fully inflected in the second inflection state. As described above, it has been hard for the multilayer circuit substrate 500 to be inflected in any direction.

SUMMARY OF THE INVENTION

Therefore, preferred embodiments of the present invention provide a signal line capable of being easily inflected and a manufacturing method therefor.

A signal line according to a preferred embodiment of the present invention includes a laminated body including at least a first insulator layer, a second insulator layer, and a third insulator layer that include flexible material and are laminated from an upper side to a lower side in this order; a first ground conductor fixed to a main surface on an upper side of the first insulator layer; a wiring conductor provided in a main surface of the second insulator layer; and a second ground conductor provided in a main surface of the third insulator layer, wherein the first ground conductor, the wiring conductor, and the second ground conductor define a stripline structure, and the laminated body is inflected so that the third insulator layer is located on an inner periphery side, compared with a location of the first insulator layer.

A manufacturing method for a signal line according to a preferred embodiment of the present invention includes a process preparing a first insulator layer including a main surface on an upper side of which a first ground conductor is fixed, a second insulator layer including a main surface in which a wiring conductor is provided, and a third insulator layer including a main surface on which a second ground conductor is provided; and a process of obtaining a laminated body by laminating the first insulator layer, the second insulator layer, and the third insulator layer from an upper side to a lower side in this order so that the first ground conductor, the wiring conductor, and the second ground conductor define a stripline structure, wherein the laminated body is inflected so that the third insulator layer is located on an inner periphery side, compared with a location of the first insulator layer.

According to various preferred embodiments of the present invention, it is possible to easily inflect a signal line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a signal line and a manufacturing method therefor according to preferred embodiments of the present invention will be described with reference to drawings.

Figure 1:
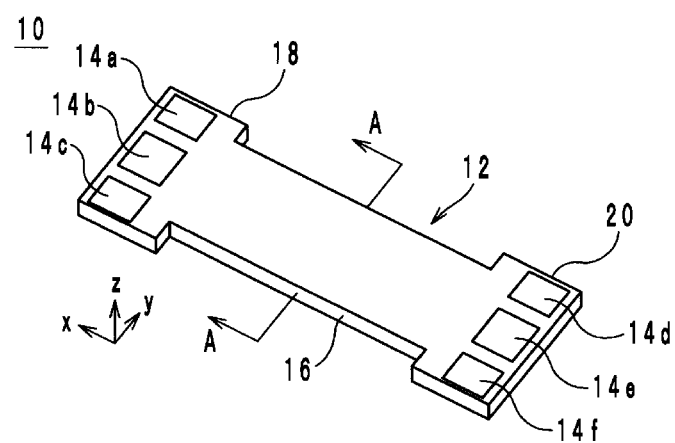
FIG. 1 is an external appearance perspective view of a signal line according to a first preferred embodiment of the present invention.
Figure 2A:
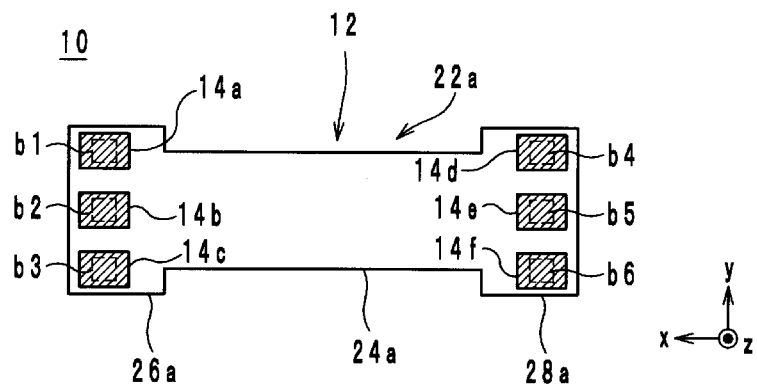
FIGS. 2A-2D are exploded views of the signal line in FIG. 1.
Figure 2B:
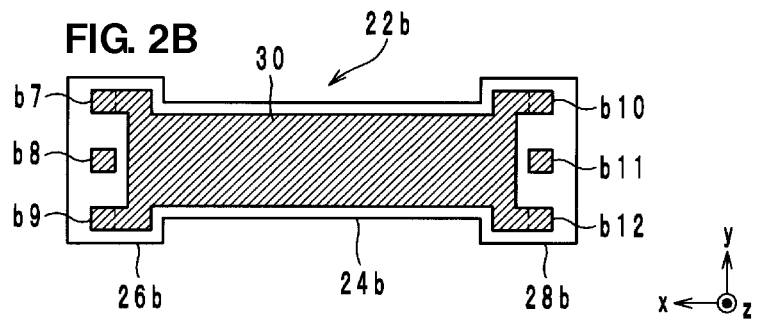
Figure 2C:
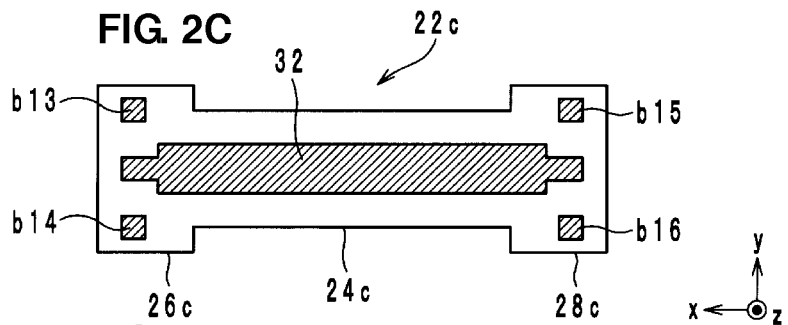
Figure 2D:
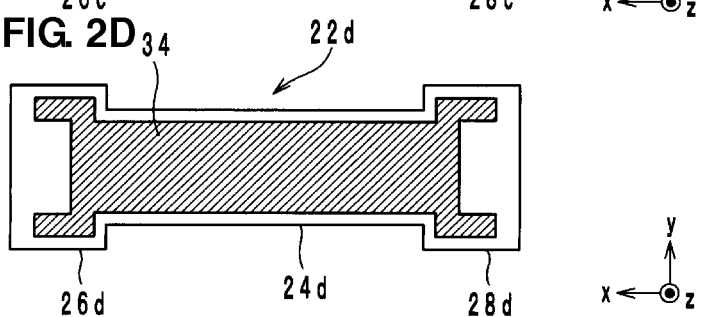
Figure 3:
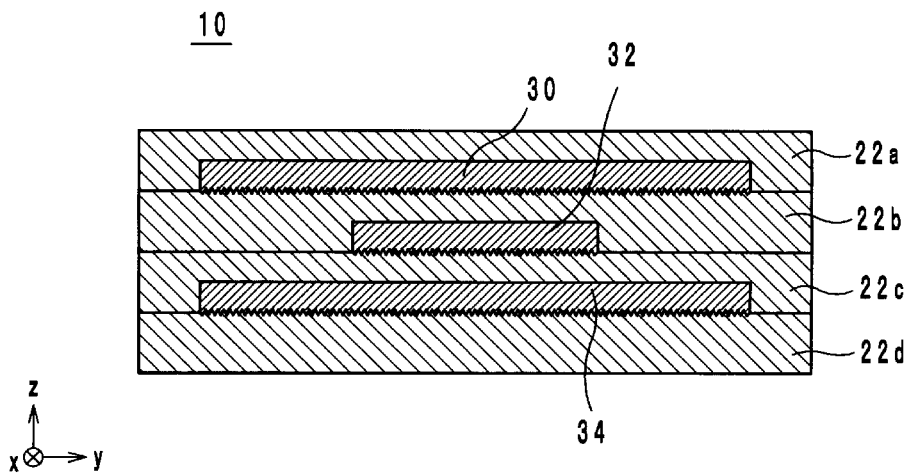
FIG. 3 is a cross-section structure diagram along A-A in FIG. 1.

Hereinafter, the configuration of a signal line according to preferred embodiments of the present invention will be described with reference to drawings. FIG. 1 is an external appearance perspective view of a signal line 10 according to a preferred embodiment of the present invention. FIGS. 2A-2D are exploded views of the signal line 10 in FIG. 1. FIG. 3 is a cross-section structure diagram along A-A in FIG. 1. In FIG. 1 to FIG. 3, the lamination direction of the signal line 10 is defined as a z axis direction. In addition, the longitudinal direction of the signal line 10 is defined as an x axis direction, and a direction perpendicular to the x axis direction and the z axis direction is defined as a y axis direction.

For example, the signal line 10 connects two circuit substrates to each other in an electronic device such as a mobile phone or the like. As illustrated in FIG. 1 and FIGS. 2A-2D, the signal line 10 includes a main body 12, external terminals 14 (14a to 14f), ground conductors 30 and 34, a signal line (wiring conductor) 32, and via hole conductors b1 to b16.

As illustrated in FIG. 1, a main body 12 includes a signal line portion 16 and connector portions 18 and 20. The signal line portion 16 extends in the x axis direction, and includes the signal line 32 and the ground conductors 30 and 34. The signal line portion 16 is configured so as to be able to be bent into a U shape. The connector portions 18 and 20 are provided at both ends of the signal line portion 16 in the x axis direction, and connected to the connectors of the circuit substrates not illustrated. Insulation sheets (insulator layers) 22 (22a to 22d) illustrated in FIGS. 2A-2D are laminated from a positive direction side in the z axis direction to a negative direction side therein in this order, thereby configuring the main body 12.

The insulation sheet 22 is preferably made of thermoplastic resin such as liquid crystalline polymer having flexibility, or the like. As illustrated in FIGS. 2A-2D, the insulation sheets 22a to 22d preferably include signal line portions 24a to 24d, connector portions 26a to 26d, and connector portions 28a to 28d, respectively. The signal line portion 24 configures the signal line portion 16 of the main body 12, and the connector portions 26 and 28 configure the connector portions 18 and 20 of the main body 12, respectively. In addition, hereinafter, a main surface on a positive direction side in the z axis direction of the insulation sheet 22 is referred to as a front surface, and a main surface on a negative direction side in the z axis direction of the insulation sheet 22 is referred to as a back surface.

As illustrated in FIGS. 2A-2D, the external terminals 14a to 14c are arranged so as to define a line in the y axis direction on the front surface of the connector portion 26a. When the connector portion 18 is inserted into the connector of the circuit substrate, the external terminals 14a to 14c are in contact with terminals within the connector. Specifically, the external terminals 14a and 14c are in contact with ground terminals within the connector, and the external terminal 14b is in contact with a signal terminal within the connector. Accordingly, a ground potential is applied to the external terminals 14a and 14c, and a high-frequency signal (for example, 2 GHz) is applied to the external terminal 14b.

As illustrated in FIGS. 2A-2D, the external terminals 14d to 14f are arranged so as to define a line in the y axis direction on the front surface of the connector portion 28a. When the connector portion 20 is inserted into the connector of the circuit substrate, the external terminals 14d to 14f are in contact with terminals within the connector. Specifically, the external terminals 14d and 14f are in contact with ground terminals within the connector, and the external terminal 14e is in contact with a signal terminal within the connector. Accordingly, a ground potential is applied to the external terminals 14d and 14f, and a high-frequency signal (for example, 2 GHz) is applied to the external terminal 14e.

As illustrated in FIGS. 2A-2D, the signal line (wiring conductor) 32 is arranged such that the signal line 32 is securely fixed to the front surface of the insulation sheet (second insulator layer) 22c. Specifically, the signal line 32 extends in the x axis direction on the front surface of the insulation sheet 24c. In addition, both ends of the signal line are located at the connector portions 26c and 28c, respectively. In addition, as illustrated in FIG. 3, the surface roughness of the main surface (back surface) on the negative direction side of the signal line 32 in the z axis direction is larger than the surface roughness of the main surface (front surface) on the positive direction side of the signal line 32 in the z axis direction so that the signal line 32 adheres tightly to the insulation sheet 22c. Specifically, the surface roughness of the back surface of the signal line 32 preferably is greater than or equal to about 9 μm and less than or equal to about 50 μm, and the surface roughness of the front surface of the signal line 32 is greater than or equal to 0 μm and less than or equal to about 6 μm, for example. Accordingly, as illustrated in FIG. 3, the back surface of the signal line 32 is buried in the front surface of the insulation sheet 22c, and hence the signal line 32 is securely fixed to the insulation sheet 22c.

As illustrated in FIGS. 2A-2D, the ground conductor 30 is provided on a positive direction side in the z axis direction, compared with the signal line 32, and more specifically, is provided in a state in which the ground conductor 30 is securely fixed to the front surface of the insulation sheet 22b. The ground conductor 30 extends in the x axis direction on the front surface of the signal line portion 24b. One end of the ground conductor 30 is arranged such that the end thereof branches into two portions in the connector portion 26b, and the other end of the ground conductor 30 is arranged such that the end thereof branches into two portions in the connector portion 28b. Furthermore, as illustrated in FIGS. 2A-2D and FIG. 3, the ground conductor 30 overlaps with the signal line 32 in a planar view seen from the z axis direction. In addition, the front surface of the ground conductor 30 is covered by the insulation sheet 22a.

In addition, as illustrated in FIG. 3, the surface roughness of the main surface (back surface) on the negative direction side of the ground conductor 30 in the z axis direction is larger than the surface roughness of the main surface (front surface) on the positive direction side of the ground conductor 30 in the z axis direction so that the ground conductor (first ground conductor) 30 adheres tightly to the insulation sheet (first insulator layer) 22b. Specifically, the surface roughness of the back surface of the ground conductor 30 is preferably greater than or equal to about 9 µm and less than or equal to about 50 µm, and the surface roughness of the front surface of the ground conductor 30 is greater than or equal to 0 µm and less than or equal to about 6 µm, for example. Accordingly, as illustrated in FIG. 3, the back surface of the ground conductor 30 is buried in the front surface of the insulation sheet 22b, and hence the ground conductor 30 is securely fixed to the insulation sheet 22b.

As illustrated in FIGS. 2A-2D, the ground conductor 34 is provided on a negative direction side in the z axis direction, compared with the signal line 32, and more specifically, is arranged such that the ground conductor 34 is securely fixed to the front surface of the insulation sheet 22d. The ground conductor 34 extends in the x axis direction on the front surface of the signal line portion 24d. One end of the ground conductor 34 is arranged such that the end thereof branches into two portions in the connector portion 26d, and the other end of the ground conductor 34 is arranged such that the end thereof branches into two portions in the connector portion 28d. Furthermore, as illustrated in FIGS. 2A-2D and FIG. 3, the ground conductor 34 overlaps with the signal line 32 in a planar view seen from the z axis direction.

In addition, as illustrated in FIG. 3, the surface roughness of the main surface (back surface) on the negative direction side of the ground conductor 34 in the z axis direction is larger than the surface roughness of the main surface (front surface) on the positive direction side of the ground conductor 34 in the z axis direction so that the ground conductor (second ground conductor) 34 adheres tightly to the insulation sheet (third insulator layer) 22d. Specifically, the surface roughness of the back surface of the ground conductor 34 is greater than or equal to about 9 µm and less than or equal to about 50 µm, and the surface roughness of the front surface of the ground conductor 34 is greater than or equal to 0 µm and less than or equal to about 6 µm, for example. Accordingly, as illustrated in FIG. 3, the back surface of the ground conductor 34 is buried in the front surface of the insulation sheet 22d, and hence the ground conductor 34 is securely fixed to the insulation sheet 22d.

As illustrated in FIGS. 2A-2D, the via hole conductors b1 and b3 are provided so as to penetrate through the connector portion 26a in the z axis direction, and connect the external terminals 14a and 14c to the ground conductor 30, respectively. As illustrated in FIGS. 2A-2D, the via hole conductor b2 is provided so as to penetrate through the connector portion 26a in the z axis direction, and is connected to the external terminal 14b.

As illustrated in FIGS. 2A-2D, each of the via hole conductors b7 and b9 is provided so as to penetrate through the connector portion 26b in the z axis direction, and is connected to the ground conductor 30. As illustrated in FIGS. 2A-2D, the via hole conductor b8 is provided so as to penetrate through the connector portion 26b in the z axis direction, and connects the via hole conductor b2 and the signal line 32 to each other.

As illustrated in FIGS. 2A-2D, the via hole conductors b13 and b14 are provided so as to penetrate through the connector portion 26c in the z axis direction, and connect the via hole conductors b7 and b9 to the ground conductor 34, respectively. Accordingly, the external terminal 14a is connected to the ground conductors 30 and 34 through the via hole conductors b1, b7, and b13, and the external terminal 14c is connected to the ground conductors 30 and 34 through the via hole conductors b3, b9, and b14. In addition, the external terminal 14b and the signal line 32 are connected to each other through the via hole conductors b2 and b8.

As illustrated in FIGS. 2A-2D, the via hole conductors b4 and b6 are arranged so as to penetrate through the connector portion 28a in the z axis direction, and connect the external terminals 14d and 14f to the ground conductor 30, respectively. As illustrated in FIGS. 2A-2D, the via hole conductor b5 is provided so as to penetrate through the connector portion 28a in the z axis direction, and is connected to the external terminal 14e.

As illustrated in FIGS. 2A-2D, each of the via hole conductors b10 and b12 is provided so as to penetrate through the connector portion 28b in the z axis direction, and is connected to the ground conductor 30. As illustrated in FIGS. 2A-2D, the via hole conductor b11 is provided so as to penetrate through the connector portion 28b in the z axis direction, and connects the via hole conductor b5 and the signal line 32 to each other.

As illustrated in FIGS. 2A-2D, the via hole conductors b15 and b16 are provided so as to penetrate through the connector portion 28c in the z axis direction, and connect the via hole conductors b10 and b12 to the ground conductor 34, respectively. Accordingly, the external terminal 14d is connected to the ground conductors 30 and 34 through the via hole conductors b4, b10, and b15, and the external terminal 14f is connected to the ground conductors 30 and 34 through the via hole conductors b6, b12, and b16. In addition, the external terminal 14e and the signal line 32 are connected to each other through the via hole conductors b5 and b11.

The insulation sheets 22a to 22d having the above-mentioned configurations are laminated, and hence the ground conductors 30 and 34 and the signal line 32 define a stripline structure. More specifically, as illustrated in FIGS. 2A-2D and FIG. 3, the signal line 32 is sandwiched in between the ground conductor 30 and the ground conductor 34 in the z axis direction, and is housed within a region in which the ground conductors 30 and 34 are provided, in a planar view seen from the z axis direction. Furthermore, all of the ground conductor 30, the signal line 32, and the ground conductor 34 are securely fixed to the front surfaces of the insulation sheets 22b to 22d on which these are provided.

The signal line 10 having the above-mentioned configuration is used in a state in which the signal line 10 is inflected so that the insulation sheet 22d is located on an inner periphery side, compared with a location of the insulation sheet 22b. More specifically, in a planar view seen from the y axis direction, the signal line 10 is inflected so as to define a U shape protruding toward a positive direction side in the z axis direction.

Hereinafter, a manufacturing method for the signal line 10 will be described with reference to FIGS. 2A-2D. While, hereinafter, a case in which one signal line 10 is manufactured will be described as an example, actually, large-sized insulation sheets preferably are laminated and cut, thereby simultaneously manufacturing a plurality of the signal lines 10.

First, the insulation sheet 22 is prepared where copper foil is formed on the entire surface of the front surface. Processing is performed so that the surface roughness of the front surface of the copper foil of the prepared insulation sheet 22 becomes smaller than the surface roughness of the back surface. Specifically, the front surface of the copper foil of the insulation sheet 22 is preferably plated with zinc or the like, thereby being smoothed, for example.

Next, the external terminal 14 illustrated in FIGS. 2A-2D is formed on the front surface of the insulation sheet (fourth insulator layer) 22a preferably through a photolithography process. Specifically, on the copper foil of the insulation sheet 22a, a resist having the same shape as the external terminal 14 illustrated in FIGS. 2A-2D is printed. In addition, the copper foil is subjected to etching processing, thereby removing the copper foil of a portion not covered with the resist. After that, the resist is removed. Accordingly, such an external terminal 14 as illustrated in FIGS. 2A-2D is formed on the front surface of the insulation sheet 22a.

Next, the ground conductor (first ground conductor) 30 illustrated in FIGS. 2A-2D is formed on the front surface of the insulation sheet (first insulator layer) 22b preferably through a photolithography process. In addition, the signal line (wiring conductor) 32 illustrated in FIGS. 2A-2D is formed on the front surface of the insulation sheet (second insulator layer) 22c preferably through a photolithography process. In addition, the ground conductor (second ground conductor) 34 illustrated in FIGS. 2A-2D is formed on the front surface of the insulation sheet (third insulator layer) 22d preferably through a photolithography process. In addition, since these photolithography processes are preferably the same as the photolithography process performed when the external terminal 14 is formed, the descriptions thereof will be omitted. As a result of the above-mentioned processes, the insulation sheets 22b and 22d, to the front surfaces of which the ground conductors 30 and are securely fixed, and the insulation sheet 22c, to the front surface of which the signal line 32 is securely fixed, are prepared.

Next, positions at which the via hole conductors b1 to b16 of the insulation sheets 22a to 22c are to be formed are irradiated with a laser beam from a back surface side, thereby forming via holes. After that, via holes formed in the insulation sheets 22a to 22c are filled with conductive paste whose main component is copper, thereby forming the via hole conductors b1 to b16 illustrated in FIGS. 2A-2D.

Next, the insulation sheets 22a to 22d are stacked from a positive direction side in the z axis direction to a negative direction side therein in this order so that the ground conductor 30, the signal line 32, and the ground conductor 34 define a stripline structure. In addition, pressure is applied on the insulation sheets 22a to 22d from the positive direction side in the z axis direction and the negative direction side therein, and hence the insulation sheets 22a to 22d are fixed by applying pressure. Accordingly, the signal line 10 illustrated in FIG. 1 is obtained.

According to such a signal line 10 as described above, it is possible to easily bend the signal line 10 into a U shape, as described below. More specifically, the multilayer circuit substrate 500 described in Japanese Unexamined Patent Application Publication No. 2004-311627 has a problem in that it is difficult to inflect and use the multilayer circuit substrate 500. More specifically, the multilayer circuit substrate 500 is inflected so that the strip-shaped conductor pattern 506 defines a U shape. In this case, there exists the first inflection state in which the ground conductor pattern 504a is located on an outer periphery side and the ground conductor pattern 504b is located on an inner periphery side and the second inflection state in which the ground conductor pattern 504a is located on an inner periphery side and the ground conductor pattern 504b is located on an outer periphery side.

Here, in the first inflection state, from among the insulation base materials 502a to 502d, the insulation base material 502a located on an outermost periphery side is subjected to the largest tensile stress. However, the ground conductor pattern 504a adheres tightly to the insulation base material 502a on the main surface on the upper side. Since being manufactured using metal foil, it is hard for the ground conductor pattern 504a to stretch compared with the insulation base material 502a. Therefore, it is hard for the insulation base material 502a to fully stretch. As a result, it is hard for the multilayer circuit substrate 500 to be fully inflected in the first inflection state.

On the other hand, in the second inflection state, from among the insulation base materials 502a to 502d, the insulation base material 502d located on an outermost periphery side is subjected to the largest tensile stress. However, the ground conductor pattern 504b adheres tightly to the insulation base material 502d on the main surface on the lower side. Since being manufactured using metal foil, it is hard for the ground conductor pattern 504b to stretch compared with the insulation base material 502d. Therefore, it is hard for the insulation base material 502d to fully stretch. As a result, it is hard for the multilayer circuit substrate 500 to be fully inflected in the second inflection state. As described above, it has been hard for the multilayer circuit substrate 500 to be inflected in any direction.

On the other hand, the signal line 10 is used in a state in which the signal line 10 is inflected so that the insulation sheet 22d is located on an inner periphery side, compared with the insulation sheet 22b. More specifically, in a planar view seen from the y axis direction, the signal line 10 is inflected so as to form a U shape protruding toward a positive direction side in the z axis direction. At this time, from among the insulation sheet 22a to 22d, the insulation sheet 22a located on an outermost periphery side is subjected to the largest tensile stress. In this regard, however, in the signal line 10, the ground conductor 30 that is hard to stretch is securely fixed to the insulation sheet 22b and is not securely fixed to the insulation sheet 22a. More properly, the fixing strength (adhesion strength) between the ground conductor 30 and the insulation sheet 22a is sufficiently small compared with the fixing strength (adhesion strength) between the ground conductor 30 and the insulation sheet 22b. Accordingly, even if a great tensile stress occurs in the insulation sheet 22a, slipping occurs between the insulation sheet 22a and the ground conductor 30. As a result, the tensile stress does not directly travel from the insulation sheet 22a to the ground conductor 30. Accordingly, in the signal line 10, it is possible for the insulation sheet 22a located on an outermost periphery side to easily stretch compared with the insulation base material 502a located on the outermost periphery side of the multilayer circuit substrate 500 described in Japanese Unexamined Patent Application Publication No. 2004-311627. As a result, it is possible to easily inflect the signal line 10, compared with the multilayer circuit substrate 500.

Figure 6:
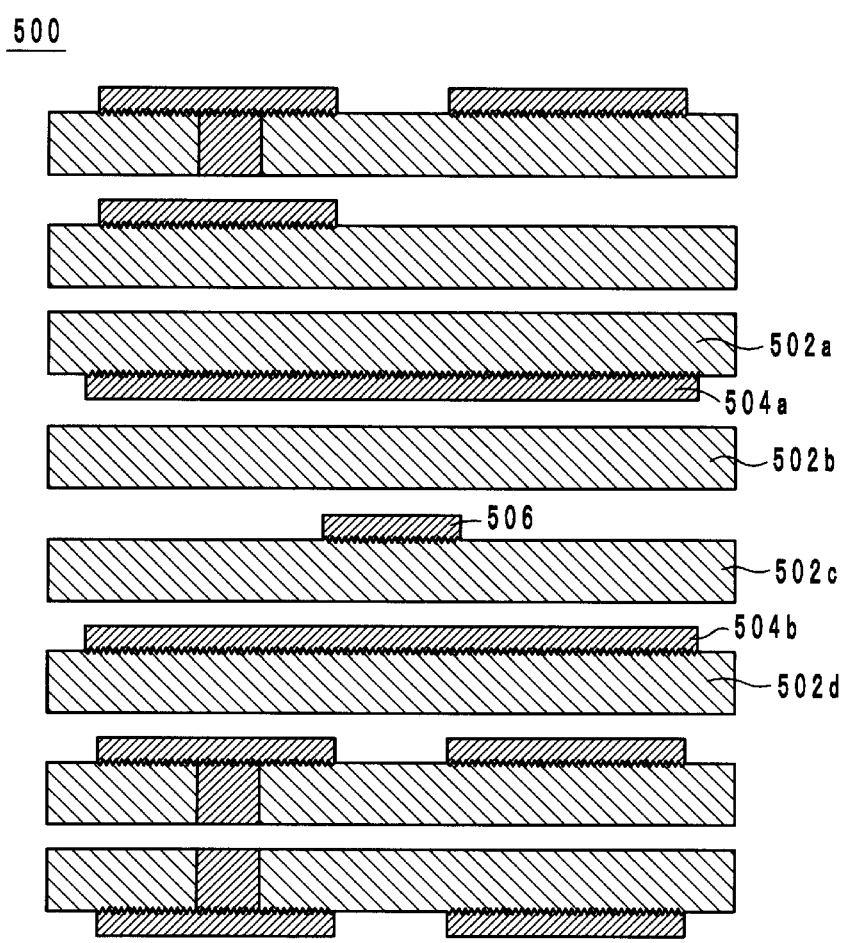
FIG. 6 is a cross-section structure diagram of a multilayer circuit substrate described in Japanese Unexamined Patent Application Publication No. 2004-311627.

Furthermore, in the signal line 10, as described below, it is possible to reduce the change of characteristic impedance occurring at the time of inflection. More specifically, in the multilayer circuit substrate 500 described in Japanese Unexamined Patent Application Publication No. 2004-311627, as illustrated in FIG. 6, none of the ground conductor patterns 504a and 504b and the strip-shaped conductor pattern 506 is securely fixed to the insulation base material 502b. Therefore, the insulation base material 502b easily stretches compared with the insulation base materials 502a, 502c, and 502d. Therefore, at the time of the inflection of the multilayer circuit substrate 500, the insulation base material 502b may largely stretch. When the insulation base material 502b largely stretches, the thickness of the insulation base material 502b is reduced. Therefore, a distance between the ground conductor pattern 504a and the strip-shaped conductor pattern 506 is reduced, and the characteristic impedance of the multilayer circuit substrate 500 changes.

On the other hand, in the signal line 10, the signal line 32 or the ground conductor 34 is securely fixed to each of the insulation sheets 22b and 22c sandwiched in between the ground conductor 30, the signal line 32, and ground conductor 34. It is hard for the signal line 32 and the ground conductor 34 to stretch compared with the insulation sheets 22b and 22c. Therefore, at the time of the inflection of the signal line 10, the signal line 32 and the ground conductor 34 prevent the insulation sheets 22b and 22c from largely stretching. As a result, a distance between the ground conductor 30 and the signal line 32 and a distance between the signal line 32 and the ground conductor 34 are prevented from being reduced due to the reduction of the thicknesses of the insulation sheets 22b and 22c. Accordingly, in the signal line 10, the change of the characteristic impedance is reduced compared with the multilayer circuit substrate 500.

In addition, the surface roughnesses of the front surfaces of the ground conductors 30 and 34 and the signal line 32 are smaller than the surface roughnesses of the back surfaces of the ground conductors 30 and 34 and the signal line 32. Specifically, the front surfaces of the ground conductors 30 and and the signal line 32 have been subjected to a smoothing process such as zinc plating or the like. Accordingly, slipping easily occurs between the front surface of the ground conductor 30 and the back surface of the insulation sheet 22a. As a result, it is possible to easily inflect the signal line 10.

Figure 4:
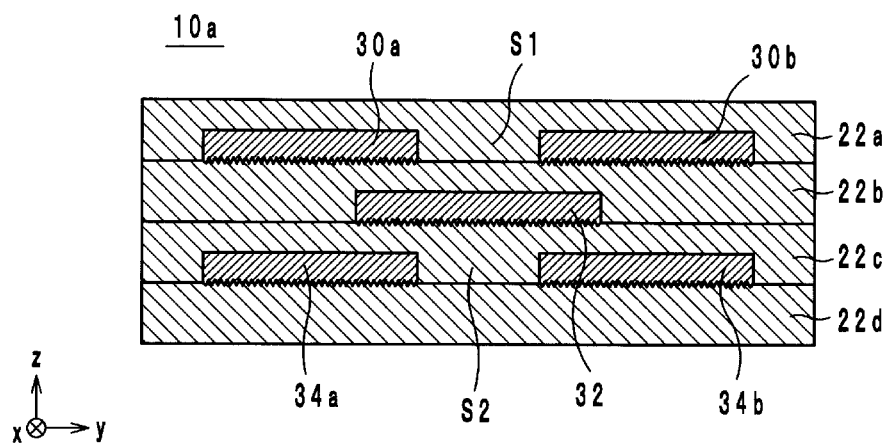
FIG. 4 is a cross-section structure diagram of a signal line according to a first example of a modification of a preferred embodiment of the present invention.

Hereinafter, a signal line 10a according to a first example of a modification will be described with reference to drawings. FIG. 4 is the cross-section structure diagram of the signal line 10a according to the first example of a modification of a preferred embodiment of the present invention.

As illustrated in FIG. 3, in the signal line 10, the signal line 32 is covered up by the ground conductors 30 and 34 in a planar view seen from the z axis direction. However, the shapes of the ground conductors 30 and 34 are not limited to this example. Specifically, as illustrated in FIG. 4, as ground conductors 30a, 30b, 34a, and 34b, four ground conductors may also be provided, for example. In addition, a slit S1 between the ground conductors 30a and 30b overlaps with the signal line 32 in the planar view seen from the z axis direction, and a slit S2 between the ground conductors 34a and 34b overlaps with the signal line 32 in the planar view seen from the z axis direction. Accordingly, since the ground conductors 30a, 30b, 34a, and 34b are not provided in portions in which the slits S1 and S2 are provided, the signal line 10a becomes easily inflected.

Figure 5:
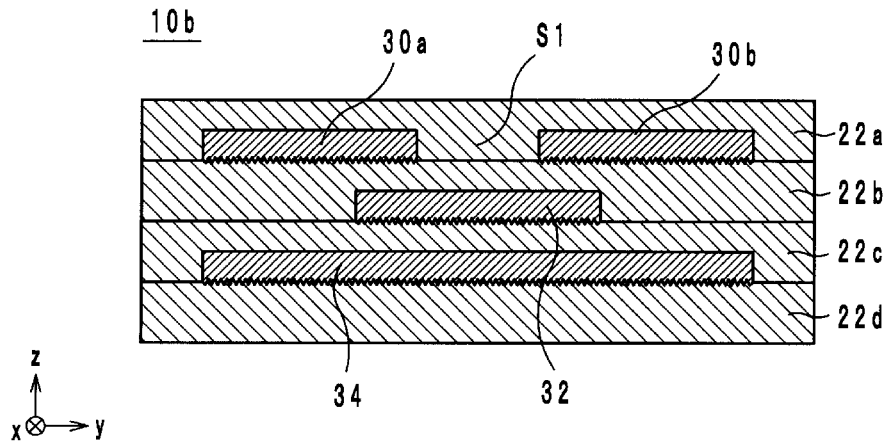
FIG. 5 is a cross-section structure diagram of a signal line according to a second example of a modification of a preferred embodiment of the present invention.

FIG. 5 is the cross-section structure diagram of a signal line 10b according to a second example of a modification of a preferred embodiment of the present invention. As the signal line 10b, the slit S1 may be only provided and the slit S2 may not be provided.

In addition, in the signal lines 10, 10a, and 10b, the ground conductors 30, 30a, 30b, 34, 34a, and 34b and the signal line 32 may be securely fixed to the insulation sheet 22 using adhesive material.

In addition, in the signal lines 10, 10a, and 10b, the ground conductors 34, 34a, and 34b and the signal line 32 may be provided on the back sides of the insulation sheets 22.

Preferred embodiments of the present invention are useful for a signal line and a manufacturing method therefor, and, in particular, are superior in that it is easily possible to inflect the signal line.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal line comprising:
   a laminated body including a plurality of insulator layers that include flexible material and are laminated on one another; and
   a first ground conductor;
   a signal conductor; and
   a second ground conductor; wherein
   each of the first ground conductor, the signal conductor, and the second ground conductor is provided in a different layer of the laminated body from one another;
   the first ground conductor, the signal conductor, and the second ground conductor define a stripline structure in which the signal conductor is located between the first ground conductor and the second ground conductor;
   the second ground conductor overlaps with the signal conductor in a planar view in a lamination direction of the laminated body;
   the first ground conductor includes a first ground conductor portion and a second ground conductor portion and a slit is disposed between the first ground conductor portion and the second ground conductor portion of the first ground conductor, and at least a portion of the slit overlaps with the signal conductor in the planar view in the lamination direction of the laminated body;
   the first ground conductor includes a first surface and a second surface opposing the first surface, the first surface being closer to the signal conductor than the second surface, and the first surface has a surface roughness larger than the second surface; and
   the laminated body is bent so that the second ground conductor is located on an inner periphery side as compared to a location of the first ground conductor.

2. The signal line according to claim 1, wherein the laminated body includes an insulator layer that covers the first ground conductor and includes flexible material.

3. The signal line according to claim 1, wherein the flexible material is made of thermoplastic resin having flexibility.

* * * * *